United States Patent
Lei et al.

(10) Patent No.: US 11,171,045 B2
(45) Date of Patent: Nov. 9, 2021

(54) DEPOSITION OF METAL FILMS WITH TUNGSTEN LINER

(71) Applicant: Applied Materials, Inc., Santa Clara, CA (US)

(72) Inventors: Yu Lei, Belmont, CA (US);
Sang-Hyeob Lee, Fremont, CA (US);
Chris Pabelico, San Jose, CA (US); Yi Xu, San Jose, CA (US); Tae Hong Ha, San Jose, CA (US); Xianmin Tang, San Jose, CA (US); Jin Hee Park, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 165 days.

(21) Appl. No.: 16/401,133

(22) Filed: May 2, 2019

(65) Prior Publication Data
US 2019/0341302 A1   Nov. 7, 2019

Related U.S. Application Data

(60) Provisional application No. 62/667,120, filed on May 4, 2018.

(51) Int. Cl.
*H01L 21/768* (2006.01)
*H01L 21/02* (2006.01)

(52) U.S. Cl.
CPC .. *H01L 21/76843* (2013.01); *H01L 21/02175* (2013.01); *H01L 21/02205* (2013.01); *H01L 21/76831* (2013.01); *H01L 21/76837* (2013.01); *H01L 21/76876* (2013.01); *H01L 21/76877* (2013.01)

(58) Field of Classification Search
CPC ......... H01L 21/76843; H01L 21/02175; H01L 21/02205; H01L 21/76831; H01L 21/76837; H01L 21/76876; H01L 21/76877
See application file for complete search history.

(56) References Cited

U.S. PATENT DOCUMENTS

| | | | |
|---|---|---|---|
| 10,204,828 B1* | 2/2019 | Bao | ............. H01L 21/76843 |
| 2004/0041264 A1 | 3/2004 | Kloster et al. | |
| 2006/0264038 A1* | 11/2006 | Kato | ............. C23C 16/45523 |
| | | | 438/656 |
| 2008/0085611 A1 | 4/2008 | Khandelwal et al. | |
| 2008/0136040 A1* | 6/2008 | Park | ............. H01L 21/76856 |
| | | | 257/774 |
| 2012/0231626 A1 | 9/2012 | Lee et al. | |

(Continued)

FOREIGN PATENT DOCUMENTS

| EP | 1094504 A2 | 4/2001 |
|---|---|---|
| KR | 20160024351 A | 3/2016 |

OTHER PUBLICATIONS

PCT International Search Report and Written Opinion in PCT/US2019/030305 dated Aug. 7, 2019, 10 pages.

*Primary Examiner* — Peter Bradford
(74) *Attorney, Agent, or Firm* — Servilla Whitney LLC

(57) ABSTRACT

Apparatuses and methods to provide electronic devices having metal films are provided. Some embodiments of the disclosure utilize a metallic tungsten layer as a liner that is filled with a metal film comprising cobalt. The metallic tungsten layer has good adhesion to the cobalt leading to enhanced cobalt gap-fill performance.

9 Claims, 1 Drawing Sheet

(56) References Cited

U.S. PATENT DOCUMENTS

| | | |
|---|---|---|
| 2014/0162451 A1 | 6/2014 | Chen et al. |
| 2016/0056077 A1* | 2/2016 | Lai .................... H01L 21/02247 438/653 |
| 2017/0148670 A1 | 5/2017 | Lei et al. |
| 2018/0144973 A1 | 5/2018 | Ye et al. |
| 2018/0145034 A1 | 5/2018 | Xu et al. |
| 2018/0166333 A1* | 6/2018 | Yang ................. H01L 23/53295 |
| 2020/0066645 A1* | 2/2020 | Farmer ............. H01L 21/76843 |

\* cited by examiner

DEPOSITION OF METAL FILMS WITH TUNGSTEN LINER

CROSS-REFERENCE TO RELATED APPLICATIONS

This application claims priority to U.S. Provisional Application No. 62/667,120, filed May 14, 2018, the entire disclosure of which is hereby incorporated by reference herein.

TECHNICAL FIELD

Embodiments of the present disclosure pertain to the field of electronic device manufacturing, and in particular, to an integrated circuit (IC) manufacturing. In particular, embodiments of the present disclosure pertain to a cobalt fill integration process using a CVD/ALD liner containing tungsten.

BACKGROUND

Integrated circuits are made possible by processes that produce intricately patterned material layers on substrate surfaces. Producing patterned material on a substrate requires controlled methods for deposition of desired materials. Selectively depositing a film on one surface relative to a different surface is useful for patterning and other applications.

A cobalt layer deposited by a CVD or ALD process generally has greater electrical resistivity relative to a similar cobalt layer deposited by a PVD process. Generally, the greater resistivity is due in part to a significant carbon content (e.g., about 5 atomic percent) as well as a high surface roughness of the thin cobalt layer deposited by a CVD or ALD process. Such high carbon contents and surface roughness significantly impact the work function of the cobalt layer as a p-type metal and generally causes a high resistance of the overall integrated gate stack or other device the cobalt layer is contained therein. Cobalt layers deposited by PVD are often non-conformal and have other irregularities that affect device performance and stability. Also, high aspect ratio features usually develop voids during the deposition of cobalt materials by PVD or CVD. Non-vapor deposition processes for cobalt, such as ECP and electrolysis, generally require exposing the substrate and all layers thereon to a liquid bath, such as an aqueous solution, while depositing the cobalt layer thereon. Also, the cobalt layers deposited by ECP and electrolysis deposition processes may often have relatively high resistivity and poor conformal films.

When it comes to advanced nodes in semiconductors, the pattern dimension becomes much more challenging for openings of <25 nm and an aspect ratio >5. Strong adhesion between a liner and bulk cobalt fill is required in order to hold the cobalt material during post deposition steps for void-free fill and also for reliability.

Therefore, a need exists for improved methods for forming cobalt layers, films, and materials and for devices containing such cobalt layers, films, and materials.

SUMMARY

Apparatuses and methods for depositing metal films are described. In one embodiment, a method comprises forming at least one feature on a top surface of a substrate, the at least one feature having two opposing side walls, a bottom, and a top surface; forming a metallic layer (containing tungsten) on the top surface and on the at least one feature; forming a metal film on a top surface of the metallic tungsten layer; and annealing the substrate.

One or more embodiments are directed to an apparatus including a metal film. In one embodiment, an electronic device comprises a substrate having a dielectric layer deposited thereon; the dielectric layer having at least one feature; a metallic tungsten layer on the dielectric layer and on the at least one feature; and a metal film on the metallic tungsten layer.

In a second embodiment, an electronic device comprises a substrate having at least one feature; a metallic tungsten layer on the substrate and on the at least one feature; and a metal film on the metallic tungsten layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

Figure 1:
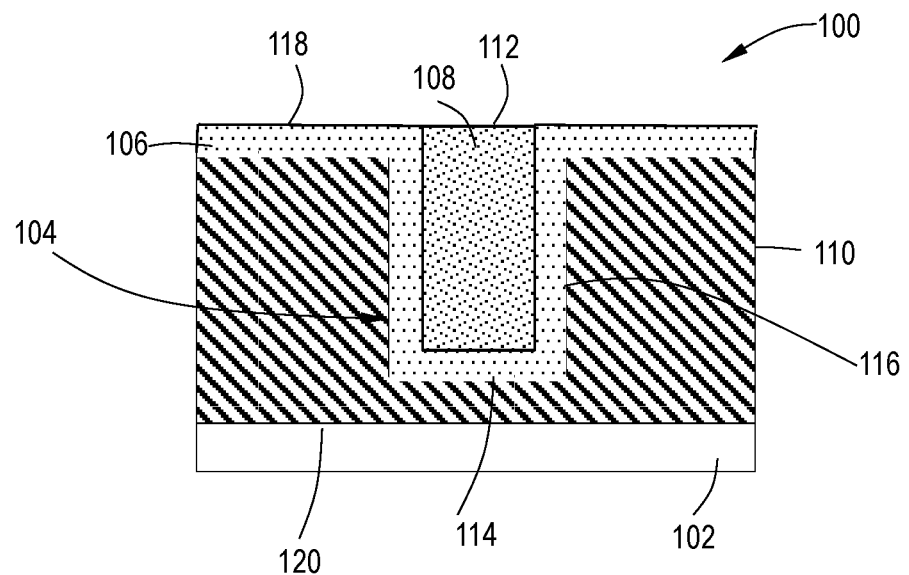
FIG. 1 shows a cross-sectional schematic view of a semiconductor device in accordance with one or more embodiment of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

As used herein, the term "liner" refers to a layer conformably formed along at least a portion of the sidewalls and/or lower surface of an opening such that a substantial portion of the opening prior to the deposition of the layer remains unfilled after deposition of the layer. In some embodiments, the liner may be formed along the entirety of the sidewalls and lower surface of the opening.

The current cobalt fill scheme is with ALD/CVD titanium nitride (TiN) or tantalum nitride (TaN) as liners followed by PVD/CVD/Plating cobalt fill. Clear limitations are observed with ALD/CVD titanium nitride (TiN) or tantalum nitride (TaN) liners due to weak adhesion to cobalt, which induces pulled-up/delamination/pinch-off voids during high thermal budget post deposition steps, and reliability and migration issues under thermal & electrical stress. Additionally, nitride (N)-treated liners like titanium nitride (TiN) or tantalum nitride (TaN) may lead to cobalt nitride (CoN, unstable at temperature >250° C.) formation on the cobalt layer that damages film morphology and stability, and produces high resistance.

Advantageously, a metallic tungsten layer that is a non-nitride based liner is used in the electronic device(s) of one or more embodiment. The metallic tungsten layer employed does not deleteriously interfere with a metal film comprising cobalt. When the metallic tungsten layer of one or more embodiments is used, no cobalt nitride (CoN) is formed.

Apparatuses and methods for depositing metal films are described. In one embodiment, a method comprises forming at least one feature on a top surface of a substrate, the at least one feature having two opposing side walls, a bottom, and a top surface; forming a metallic tungsten layer on the top surface and on the at least one feature; forming a metal film on a top surface of the metallic tungsten layer; and annealing the substrate. This metallic tungsten layer consists of tungsten dominantly and possibly other elements such as carbon, nitrogen, oxygen as well.

In one or more embodiment, an optional dielectric layer may be deposited/formed. In one embodiment, the method further comprises forming a dielectric layer on the top surface of the substrate prior to forming the metallic tungsten layer.

In some embodiments, the metallic tungsten layer is formed by exposing the substrate to plasma formed from a first gas. In some embodiments, the first gas comprises a metallic tungsten precursor gas. In some embodiments, the first gas comprises a fluorine free tungsten halide precursor, such as tungsten pentachloride ($WCl_5$) or tungsten hexachloride ($WCl_6$). In other embodiments, the first gas comprises a fluorine free tungsten oxy-halide precursor, such as $WOCl_4$ or $WO_2Cl_2$. In other embodiments, the first gas is selected from the group consisting of a fluorine free tungsten halide precursors, a chlorine free tungsten halide precursor, such as tungsten pentabromide ($WBr_5$) or tungsten hexabromide ($WBr_6$). In some embodiments, the first gas further comprises a reactant gas, such as a hydrogen containing gas, such as hydrogen ($H_2$) or ammonia ($NH_3$) or hydrazine $N_2H_4$), and a carrier gas, such as argon (Ar), helium (He), or nitrogen ($N_2$), along with the metallic tungsten precursor gas. In some embodiments, the carrier gas is an inert gas. In some embodiments, the first gas consists of, or consists essentially of, a metallic tungsten precursor gas, a reactant gas, and a carrier gas. In some embodiments, the first gas consists of, or consists essentially of a chlorine-free, fluorine-free tungsten halide precursor, a hydrogen containing gas, and an inert gas. Without intending to be bound by theory, it is thought that the presence of hydrogen in the first gas advantageously minimizes the presence of carbon impurities in the metallic tungsten liner layer. The carrier gas may be provided at a flow rate of about 10 sccm to about 10 slm.

The metallic tungsten (W) liner/layer described herein advantageously facilitates improved cobalt interconnect structures through one or more of improved cobalt reflow and improved device properties such as electron migration and time dependent dielectric break down. The inventive methods may be utilized with any device nodes, but may be particularly advantageous in device nodes of about 25 nm or less, for example about 5 nm to about 25 nm. Further, in one or more embodiments, the methods may be particularly advantageous with interconnect structures formed by re-flowing cobalt (Co) to fill an opening.

In one or more embodiments, the metal film comprises cobalt. The cobalt can be deposited by any suitable process including, but not limited to, chemical vapor deposition (CVD) and atomic layer deposition (ALD). In some embodiments, the cobalt film (also referred to as a layer or gapfill material) is deposited by CVD. In some embodiments, the cobalt film is deposited by ALD.

The Figures show substrates having a single feature for illustrative purposes; however, those skilled in the art will understand that there can be more than one feature. The shape of the feature can be any suitable shape including, but not limited to, peaks, trenches and cylindrical vias. In specific embodiments, the feature is a trench. In other specific embodiments, the feature is a via. As used in this regard, the term "feature" means any intentional surface irregularity. Suitable examples of features include, but are not limited to trenches which have a top, two sidewalls and a bottom, peaks which have a top and two sidewalls extending upward from a surface, and vias which have sidewalls extending down from a surface with an open bottom. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1. In one or more embodiments the aspect ratio is greater than 10:1.

In one or more embodiment, the at least one feature extends a depth from a top surface of the substrate or a top surface of the metallic tungsten layer to a bottom surface. The at least one feature has a width defined by a first sidewall and a second sidewall. A metal film is deposited on the metallic tungsten layer to fill the at least one feature and extend above the top surface of metallic tungsten layer. The metal film may be recessed to lower a top of the metal film to a height equal to or below the top surface of the metallic tungsten layer to form a recessed metal film. The metal film may be expanded to form pillars extending from the at least one feature.

Figure 2:
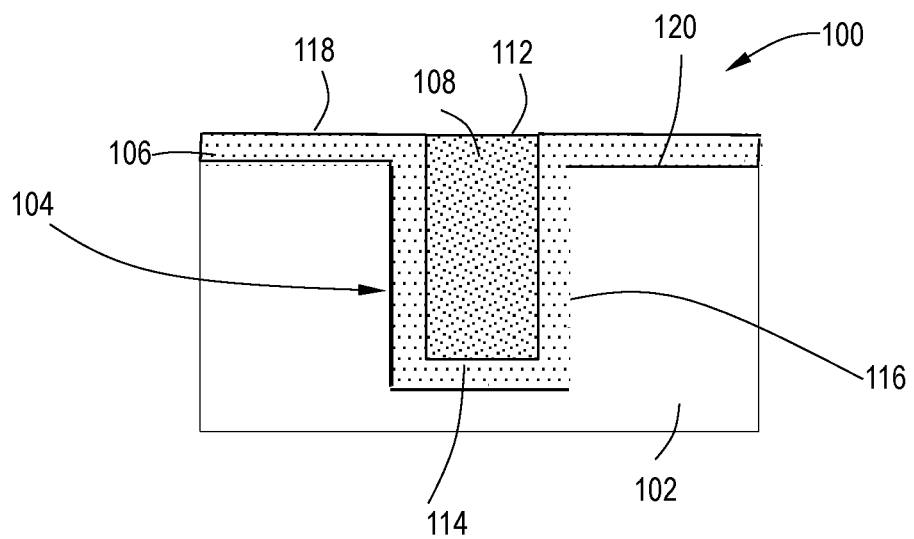
FIG. 2 shows a cross-sectional schematic view of a semiconductor device in accordance with one or more embodiment of the disclosure.

With reference to FIGS. 1 and 2, one or more embodiments are directed to methods of forming a semiconductor device 100. A substrate 102 is provided with a feature 104 filled with a metal film 108.

In one or more embodiments the metal film 108 is a cobalt layer. In one embodiment, the cobalt layer is a gapfill layer. As shown in FIG. 1, in one embodiment, metal film 108 is deposited on metallic tungsten layer/liner 106 on the top portion 114 of the feature 104, the sidewalls 116 of the feature 104 and top portions 118 of a dielectric layer 110.

In one or more embodiments the metal film 108 is a seed gapfill layer. In one embodiment, the seed gapfill layer is a selective growth seed film. As shown in FIG. 1, in one embodiment, metal film 108 is deposited on metallic tungsten layer/liner 106 on the top portion 114 of the feature 104, the sidewalls 116 of the feature 104 and top portions 118 of a dielectric layer 110.

As shown in FIG. 2, in another embodiment, metal film 108 is deposited on metallic tungsten layer/liner 106 on the top portion 114 of the feature 104, the sidewalls 116 of the feature 104 and top surface 120 of the substrate 102.

In one or more embodiment, the metal film 108 is a cobalt layer. In one or more embodiment, the cobalt layer is a cobalt gapfill layer.

In one or more embodiments the metal film 108 is a seed gapfill layer. In one or more embodiment, the seed gapfill layer is a cobalt layer, or other seed gapfill layer, such as those used to provide selective growth pillars.

In other embodiments, metal film 108 may be another suitable metal film. Suitable metal films include, but are not limited to, films including one or more of cobalt (Co), molybdenum (Mo), tungsten (W), tantalum (Ta), titanium (Ti), ruthenium (Ru), rhodium (Rh), copper (Cu), iron (Fe), manganese (Mn), vanadium (V), niobium (Nb), hafnium (Hf), zirconium (Zr), yttrium (Y), aluminum (Al), tin (Sn), chromium (Cr), lanthanum (La), iridium (Ir), or any combination thereof. In some embodiments, metal film 108 comprises is a cobalt (Co) gapfill layer.

In one embodiment, the metal film 108 is deposited using one of a deposition technique, such as but not limited to an ALD, a CVD, PVD, MBE, MOCVD, spin-on or other liner deposition techniques known to one of ordinary skill in the art of microelectronic device manufacturing. In one embodiment, the metal film 108 is deposited using a CVD deposition technique known to one of ordinary skill in the art of microelectronic device manufacturing.

In one or more embodiments, the metal film 108 comprises cobalt. In specific embodiments, the metal film 108 comprises cobalt that has been deposited by any suitable process including, but not limited to, chemical vapor deposition (CVD) and atomic layer deposition (ALD). In some embodiments, the metal film 108 comprise cobalt (also referred to as a layer or gapfill material) is deposited by CVD. The metal film 108 has a surface 112 that is exposed for further processing.

In one or more embodiment, a dielectric layer 110 is formed on the substrate 102. The dielectric layer can be any suitable dielectric material including, but not limited to, nitride, oxides, or carbides of titanium or silicon. The dielectric layer 110 can be formed conformally on the substrate 102 or non-conformally.

In one embodiment, the dielectric layer 110 includes a dielectric material having a k-value less than 5. In one embodiment, dielectric layer 110 includes a dielectric material having a k-value less than 2. In at least some embodiments, dielectric layer 110 includes oxides, carbon doped oxides, porous silicon dioxide, carbides, oxycarbides, nitrides, oxynitrides, oxycarbonitrides, polymers, phosphosilicate glass, fluorosilicate (SiOF) glass, organosilicate glass (SiOCH), or any combinations thereof. In at least some embodiments, dielectric layer 110 may include polyimide, epoxy, photodefinable materials, such as benzocyclobutene (BCB), and WPR-series materials, or spin-on-glass.

In one embodiment, the thickness of the dielectric layer 110 is in an approximate range from about 10 nanometers (nm) to about 2 microns (μm). In an embodiment, dielectric layer 110 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

In one embodiment, a metallic tungsten layer 106 is deposited on dielectric layer 110. In one embodiment, metallic tungsten layer 106 is a conductive liner. In some embodiments, metallic tungsten layer 106 is formed by exposing the substrate 102 to plasma formed from a first gas. In some embodiments, the first gas comprises a metallic tungsten precursor gas. In some embodiments, the first gas comprises a fluorine free tungsten halide precursor, such as tungsten pentachloride ($WCl_5$) or tungsten hexachloride ($WCl_6$). In other embodiments, the first gas comprises a fluorine free tungsten oxy-halide precursor, such as $WOCl_4$ or $WO_2Cl$. In other embodiments, the first gas is selected from the group consisting of a fluorine free halide precursors, a chlorine free tungsten halide precursor, such as tungsten pentabromide ($WBr_5$) or tungsten hexabromide ($WBr_6$). In some embodiments, the first gas further comprises a reactant gas, such as a hydrogen containing gas, such as hydrogen ($H_2$) or ammonia ($NH_3$) or hydrazine ($N_2H_4$), and a carrier gas, such as argon (Ar), helium (He), or nitrogen ($N_2$), along with the metallic tungsten precursor gas. In some embodiments, the carrier gas is an inert gas. In some embodiments, the first gas consists of, or consists essentially of, a metallic tungsten precursor gas, a reactant gas, and a carrier gas. In some embodiments, the first gas consists of, or consists essentially of a chlorine-free, fluorine-free tungsten precursor, a hydrogen containing gas, and an inert gas. Without intending to be bound by theory, it is thought that the presence of hydrogen in the first gas advantageously minimizes the presence of carbon impurities in the metallic tungsten liner layer. The carrier gas may be provided at a flow rate of about 100 sccm to about 3000 sccm.

In an embodiment, metallic tungsten layer 106 is deposited to the thickness from about 5 Å to about 35 Å. In an embodiment, metallic tungsten layer 106 is deposited to a thickness in a range from about 10 Å to about 30 Å. Without intending to be bound by theory, it is thought that the metallic tungsten layer/liner of one or more embodiments provides metal films with less dewetting than with comparable thickness liners comprising TiN. In specific embodiments, the metallic tungsten layer/liner provides enhanced cobalt adhesion with tungsten, and no dewetting is observed on metallic tungsten thinner than 10 Å while worse adhesion on TiN.

In one or more embodiment, the metal film 108 comprises cobalt and shows enhanced adhesion on tungsten, even with 10 Å tungsten liner compared to on titanium nitride (TiN) liner. In one or more embodiment, after hydrogen ($H_2$) anneal, the metal film 108 comprising cobalt did not show any de-wetting on a 10 to 30 Å tungsten liner, while the metal film 108 comprising cobalt dewetted on a titanium nitride (TiN) liner.

In one or more embodiment, metallic tungsten layer/liner 106 provides an electronic device with lower resistance that an electronic device having a titanium nitride (TiN) or tantalum nitride (TaN) liner.

In one or more embodiment, there is no diffusion or very limited intermixing between the metallic tungsten layer 106 and the metal film 108 comprising cobalt. In one or more embodiment, there is no oxidation of the metal film 108 when the metallic tungsten layer 106 is deposited. Without intending to be bound by theory, it is thought that when the metallic tungsten layer 106 comprises a fluorine (F), chlorine (Cl)-free tungsten layer/liner, the liner blocks fluorine from interacting with the metal film 108.

In some embodiments, the metallic tungsten precursor is flowed into a processing chamber containing the substrate 102 with an inert, carrier and/or diluent gas. The metallic tungsten precursor can chemisorb to the substrate 102 or dielectric layer 110 to leave a chemisorbed metallic tungsten precursor on the substrate or dielectric layer. A co-reactant can then be flowed into the processing chamber to react with the chemisorbed metallic tungsten precursor to deposit metallic tungsten layer 106. In some embodiments, the precursor is co-flowed into the processing chamber with a co-reactant. The precursor and co-reactant can react in the gas phase and form a species that deposit onto the substrate or patterned film to grow the film 140.

In an embodiment, the metallic tungsten layer 106 is deposited using an atomic layer deposition (ALD) technique. In one embodiment, the metallic tungsten layer 106 is deposited using one of deposition techniques, such as but not limited to a CVD, PVD, MBE, MOCVD, spin-on, or other liner deposition techniques know to one of ordinary skill in the art of microelectronic device manufacturing.

After formation, the metal film 108 is annealed at low temperature and high pressure. As used in this regard, the term "low temperature" means that the maximum temperature during the annealing process is less than or equal to about 400° C. In some embodiments, the maximum annealing temperature is less than or equal to about 375° C., 350° C., 325° C., 300° C., 275° C., 250° C., 225° C., 200° C., 180° C., or 150° C. As used in this regard, the term "high pressure" means a pressure greater than or equal to about 1 Torr. In some embodiments, the annealing pressure is greater than or equal to 2 Torr, 3 Torr, 4 Torr, 5 Torr, 6 Torr, 7 Torr, 8 Torr, 9 Torr, 10 Torr, 15 Torr, 20 Torr, 25 Torr, 30 Torr, 35 Torr, 40 Torr, 45 Torr, 50 Torr, 60 Torr, 70 Torr, 80 Torr, 90 Torr, 100 Torr, 110 Torr, 120 Torr, 130 Torr, 140 Torr, 150 Torr, 200 Torr, 250 Torr, 300 Torr, 350 Torr, 400 Torr, 450 Torr, 500 Torr, 550 Torr, 600 Torr, 650 Torr, or 700 Torr. In some embodiments, the annealing pressure is in the range of about 1 Torr to about 700 Torr, or in the range of about 5 Torr to about 100 Torr, or in the range of about 10 Torr to about 80 Torr.

The atmosphere during the annealing process can be varied depending on, for example, the metal silicide film. In some embodiments, the metal silicide film has an annealing atmosphere comprising one or more of hydrogen, deuterium and argon. In some embodiments, the annealing atmosphere comprises about 2% $H_2$ in argon, 4% $H_2$ in argon, 6% $H_2$ in argon, 8% $H_2$ in argon or 10% $H_2$ in argon. In some embodiments, the annealing atmosphere consists essentially of hydrogen in argon. In some embodiments, the annealing atmosphere comprises deuterium. In some embodiments, the annealing atmosphere consists essentially of deuterium. In some embodiments, the annealing atmosphere consists essentially of argon. As used in this manner, the annealing atmosphere "consisting essentially of" a component means that the atmosphere is greater than or equal to about 98%, 99% or 99.5% of the stated component.

The annealing atmosphere can be under static conditions or constant flow conditions. In some embodiments, the annealing atmosphere is static so that annealing occurs substantially without flowing gas. For example, the annealing chamber might be pressurized with the predetermined atmospheric components and then sealed so that there is no flow of gas within the chamber.

The annealed metallic tungsten layer/liner 106 has a resistivity less than or equal to about 20 ohms-cm, 19 ohms-cm, 18 ohms-cm, 17 ohms-cm, 16 ohms-cm, 15 ohms-cm, 14 ohms-cm, 13 ohms-cm, 12 ohms-cm, 11 ohms-cm or 10 ohms-cm. In one or more embodiment, the annealed metallic tungsten layer/liner 106 shows greater than 50% less resistivity than a layer/liner comprising a ALV/CVD titanium nitride (TiN). In one or more embodiment, the annealed metallic tungsten layer/liner 106 shows greater than 75% less resistivity than a layer/liner comprising a ALV/CVD titanium nitride (TiN).

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

What is claimed is:

1. A method for depositing a metal film, the method comprising:
   forming at least one feature on a top surface of a substrate;
   exposing the substrate to a plasma formed from a first gas to form a non-nitride based metallic tungsten layer on the top surface and on the at least on feature, the first gas comprising a metallic tungsten precursor gas selected from the group consisting of a fluorine free tungsten oxy-halide precursor, a chlorine free tungsten halide precursor, and a fluorine-free, chlorine-free tungsten precursor;
   forming a cobalt film on a top surface of the non-nitride based metallic tungsten layer; and
   annealing the substrate.

2. The method of claim 1, further comprising forming a dielectric layer on the top surface of the substrate prior to forming the non-nitride based metallic tungsten layer.

3. The method of claim 1, wherein the first gas comprises a fluorine-free, chlorine-free tungsten precursor.

4. The method of claim 1, wherein the first gas further comprises a reactant gas.

5. The method of claim 4, wherein the reactant gas is selected from the group consisting of hydrogen ($H_2$), ammonia ($NH_3$), and hydrazine ($N_2H_4$).

6. The method of claim 1, wherein the first gas further comprises a carrier gas selected from the group consisting of argon (Ar), helium (He), nitrogen ($N_2$).

7. The method of claim 1, wherein the cobalt film comprises CVD cobalt.

8. The method of claim 1, wherein the at least one feature is selected from a trench, a via, or a peak.

9. The method of claim 1, wherein the annealing occurs in an atmosphere of $H_2$ (gas).

* * * * *